(12) United States Patent
Kumar et al.

(10) Patent No.: US 9,040,409 B2
(45) Date of Patent: May 26, 2015

(54) METHODS OF FORMING SOLAR CELLS AND SOLAR CELL MODULES

(71) Applicant: Applied Materials, Inc., Santa Clara, CA (US)

(72) Inventors: Prabhat Kumar, Fremont, CA (US); Michael P. Stewart, San Francisco, CA (US); Kalyan Rapolu, Santa Clara, CA (US); Lin Zhang, San Jose, CA (US); Hari K. Ponnekanti, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/213,316

(22) Filed: Mar. 14, 2014

(65) Prior Publication Data
US 2014/0273338 A1    Sep. 18, 2014

Related U.S. Application Data

(60) Provisional application No. 61/798,704, filed on Mar. 15, 2013.

(51) Int. Cl.
*H01L 21/44* (2006.01)
*H01L 31/0224* (2006.01)

(52) U.S. Cl.
CPC ............ *H01L 31/022425* (2013.01); *H01L 2224/73204* (2013.01); *H01L 2224/83192* (2013.01)

(58) Field of Classification Search
USPC .................................. 438/614, 615
See application file for complete search history.

(56) References Cited

U.S. PATENT DOCUMENTS

| | | | | |
|---|---|---|---|---|
| 2010/0001640 A1* | 1/2010 | Kim et al. | ...................... | 313/582 |
| 2010/0295177 A1* | 11/2010 | Ouchi | ........................... | 257/737 |
| 2012/0205689 A1* | 8/2012 | Welch et al. | ..................... | 257/91 |

FOREIGN PATENT DOCUMENTS

JP          6-120229    *  4/1994  ............ H01L 21/321

* cited by examiner

*Primary Examiner* — Reema Patel
(74) *Attorney, Agent, or Firm* — Patterson & Sheridan, LLP

(57) ABSTRACT

Embodiments of the present invention are directed to processes for making solar cells by simultaneously co-firing metal layers disposed both on a first and a second surface of a bifacial solar cell substrate. Embodiments of the invention may also provide a method forming a solar cell structure that utilize a reduced amount of a silver paste on a front surface of the solar cell substrate and a patterned aluminum metallization paste on a rear surface of the solar cell substrate to form a rear surface contact structure. Embodiments can be used to form passivated emitter and rear cells (PERC), passivated emitter rear locally diffused solar cells (PERL), passivated emitter, rear totally-diffused (PERT), "iPERC," Crystalline Reduced-cost Aluminum Fire-Through (CRAFT), pCRAFT, nCRAFT or other high efficiency cell concepts.

20 Claims, 9 Drawing Sheets

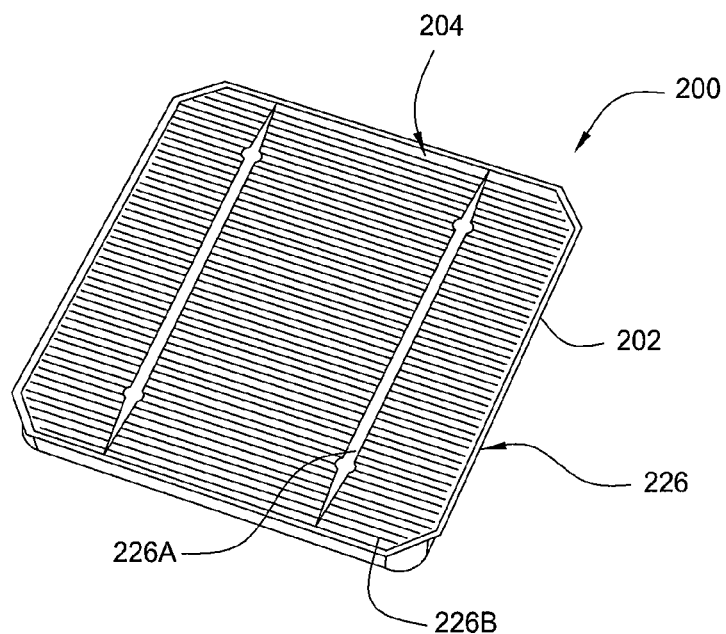
FIG. 2B
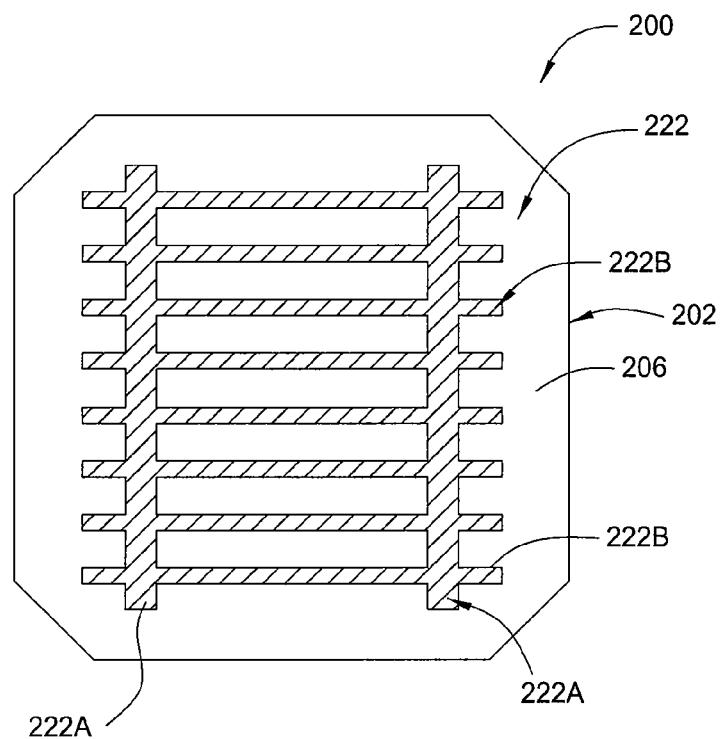
FIG. 2C
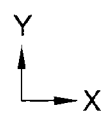

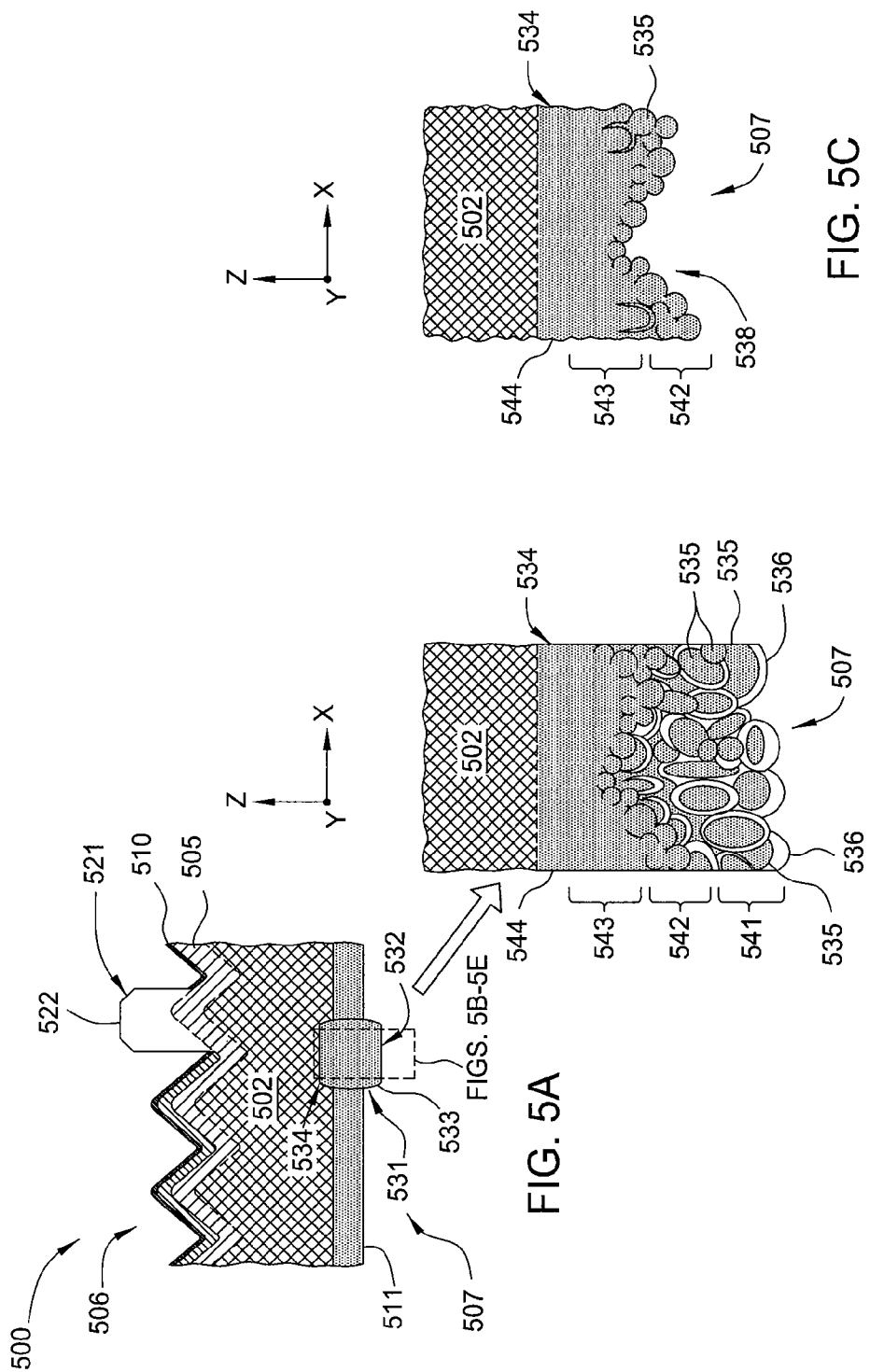

METHODS OF FORMING SOLAR CELLS AND SOLAR CELL MODULES

CROSS-REFERENCE TO RELATED APPLICATIONS

This application claims benefit of U.S. Provisional Patent Application Ser. No. 61/798,704, filed Mar. 15, 2013, which is hereby incorporated herein by reference.

BACKGROUND OF THE INVENTION

1. Field of the Invention

Embodiments of the present invention generally relate to a process for forming solar cells and solar cell modules.

2. Description of the Related Art

Solar cells are photovoltaic devices that convert sunlight directly into electrical power. The most common solar cell material is silicon, which is in the form of single or multicrystalline substrates, sometimes referred to as wafers. Because the amortized cost of forming silicon-based solar cells to generate electricity is higher than the cost of generating electricity using traditional methods, there has been an effort to reduce the cost required to form solar cells.

FIG. 1A depicts a cross sectional view of a conventional crystalline silicon type solar cell substrate, or substrate 110 that may have a passivation layer 104 formed on a surface, e.g. a back surface 125, of the substrate 110. A silicon solar cell 100 is fabricated on the crystalline silicon type solar cell substrate 110 having a textured surface 112. The substrate 110 typically includes a p-type base region 121, an n-type emitter region 122, and a p-n junction region 123 disposed therebetween. The p-n junction region 123 is formed between the p-type base region 121 and the n-type emitter region 122 to form a solar cell 100. The electrical current generates when light strikes a front surface 320 of the substrate 110. The generated electrical current flows through metal front contacts 108 and metal backside contacts 106 formed on a back surface 125 of the substrate 110.

A passivation layer 104 may be disposed between the back contact 106 and the p-type base region 121 on the back surface 125 of the solar cell 100. The passivation layer 104 may be a dielectric layer providing good interface properties that reduce the recombination of the electrons and holes, drives and/or diffuses electrons and charge carriers back to the junction region 123, and enhances light absorption in the cell by reflecting back the light at 121 and 104 interface. The passivation layer 104 is drilled and/or patterned to form openings 109 (e.g., back contact through-holes) that allow regions 107 of the back contact 106 to extend through the passivation layer 104 to be in electrical contact/communication with the p-type base region 121. The regions 107 may be formed through the passivation layer 104 so that they are electrically connected to the back contact 106 to facilitate electrical flow between the back contact 106 and the p-type base region 121. Generally, the back contact 106 is formed on the passivation layer 104 by a flood printing metal paste process, pasting metal into the openings 109 formed in the passivation layer 104. The typical flood printed or blanket deposited silver (Ag) or aluminum (Al) layer, which is used to form the rear electrical back contact 106, covers most if not the entire rear surface of the substrate 121. Due to benefits gained by use of a simplified manufacturing process, which include the elimination of the need to align the flood printed material with the formed openings 109, the flood printed back contact 106 typically includes an excessive amount of the expensive flood printed paste material to perform the task of collecting and carrying the generated current from the rear surface of the solar cell.

There are various approaches for fabricating the active regions and the current carrying metal lines, or conductors, of the solar cells. Manufacturing high efficiency solar cells at low cost is the key for making solar cells more competitive for the generation of electricity for mass consumption. The efficiency of solar cells is directly related to the ability of a cell to collect charges generated from absorbed photons in the various layers. A good passivation layer can provide a desired film property that reduces recombination of the electrons or holes in the solar cells and redirects electrons and charges back into the solar cells to generate photocurrent. It can also serve the purpose to reduce the reflection if it is used for front side or transmission or if it is used on the back side of cell. When electrons and holes recombine, the recombination energy is lost as heat energy, thereby lowering the conversion efficiency of the solar cells.

Currently, most conventional solar cells use silver (Ag) to form the electrical contacts on the front and busbar/wider contacts on rear surfaces together with blanket Al metal. The silver contacts are soldered to ribbon wire, or "strings," with conventional flux and solder materials, which is expensive and unreliable for certain types of contacts, such as fired or fire-through metal paste type contacts. Since cost is an important driver in the solar industry, it is desirable to find a way of forming a lower cost solar cell and solar cell module. One way to do this is to have fewer silver and aluminum contacts, which reduces the metal cost of the entire cell, and substitute the rear side silver contacts (called "backbus" pads) with limited area aluminum (Al) contacts. However, the aluminum backbus contacts are harder to make reliable soldered connections to, so there is a need for an innovative approach that can reliably make a stable conductive bond to the aluminum backbus contacts on the solar cell.

Therefore, there exists a need for an improved method and apparatus for manufacturing solar cell devices that have a desirable device performance as well as a low manufacturing cost.

SUMMARY OF THE INVENTION

Embodiments of the present invention may provide a method of manufacturing a solar cell device, comprising removing an amount of a first material from a region of a formed electrical contact structure formed on a surface of a substrate, depositing a conductive material to the region of the formed electrical contact structure, and bonding a first conductive element to the conductive material by delivering an amount of energy to the region and the conductive material.

Embodiments of the present invention may further provide a method of manufacturing a solar cell device, comprising removing an amount of a first conductive material from a region of a formed electrical contact structure formed on a surface of a substrate, depositing a second conductive material on the region of the formed electrical contact structure, and bonding a first conductive element to the second conductive material by delivering an amount of energy to the region and the second conductive material.

Embodiments of the present invention may further provide a method of manufacturing a solar cell device, comprising forming an electrical contact structure on a surface of a solar cell substrate by heating a metal paste that is disposed on a surface of a solar cell substrate, wherein the metal paste comprises aluminum, removing a portion of the electrical contact structure to expose at least a portion of an inter-diffused region formed in the surface of the solar cell substrate when forming the electrical contact structure, wherein removing the portion of the electrical contact structure comprises delivering a flow of an abrading material to the portion of the electrical contact structure, and depositing a conductive material on the exposed inter-diffused region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2B illustrate front view of a solar cell substrate according to an embodiment of the invention.

FIG. 2C illustrate rear view of a solar cell substrate according to an embodiment of the invention.

FIG. 5A illustrate a cross-sectional view of a solar cell substrate according to another embodiment of the invention.

FIGS. 5B-5E illustrate cross-sectional views of a contact structure formed on a solar cell substrate according to another embodiment of the invention.

Figure 1:
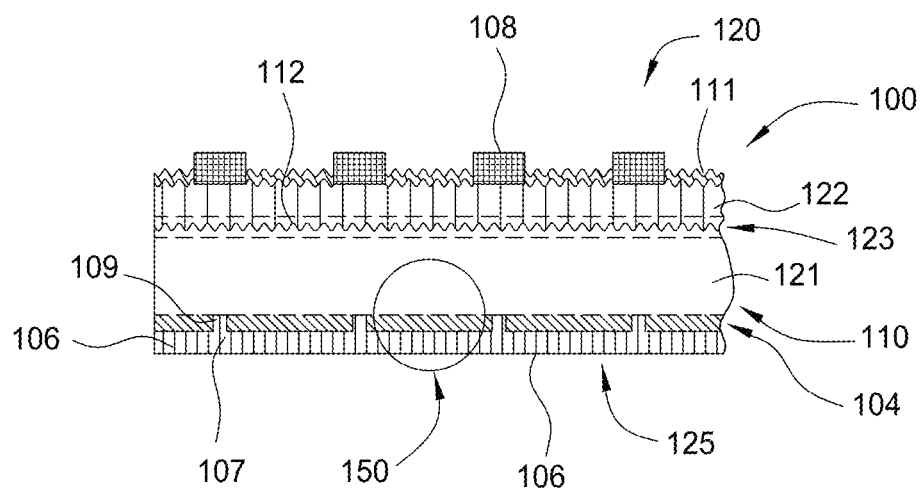
FIG. 1 illustrates a cross-sectional view of a conventional solar cell substrate.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the present invention are directed to processes for forming solar cells that can be interconnected with other solar cells or other external hardware. Particularly, embodiments of the invention provide a method of forming and/or preparing solar cells so that reliable and robust electrical connections can be made between the solar cell and the interconnecting components within a solar cell module. The solar module, or solar panel, can be used as a component of a larger photovoltaic system to generate and supply electricity in commercial and residential applications. The methods described herein can be used to reduce the manufacturing cost and increase the power output from a formed solar cell device and solar cell module, by improving the reliability and electrical characteristics of the electrical connections made to the electrical contacts to a solar cell or to multiple solar cells in a solar module. Embodiments can be used to improve the electrical connections on "passivated emitter and rear cells" (PERC), "Passivated Emitter Rear Locally Diffused Solar Cells" (PERL), "passivated emitter, rear totally-diffused" (PERT), "iPERC", emitter wrap-through (EWT), metal wrap-through (MWT), Crystalline Reduced-cost Aluminum Fire-Through (CRAFT), pCRAFT, nCRAFT, integrated back contact (IBC) or other types of cells.

One skilled in the art will appreciate that as the manufacturing cost of the solar cell substrate, which is typically the largest portion of a crystalline solar cell manufacturing cost, decreases, due to the advancements in the process of forming the crystalline silicon ingots and the wire sawing processes used to form the substrates from the ingots, the cost of the other materials used to form a solar cell device become a larger portion of the solar cell's total manufacturing cost. It has been found that conventional "flood printing," or blanket metal paste layers deposited across large portions of the rear surface of the substrate, account for a significant portion of the total cost of forming a conventional solar cell device. Some of the embodiments of the invention disclosed herein thus provide a method of preparing and reliably forming electrical interconnects to a solar cell using lower cost electrical contact materials, reduced complexity solar cell formation processes and/or use of a reduced amount metal material on a surface of the solar cell substrate. The embodiments described herein may be especially useful in enabling the formation of robust and reliable electrical interconnects to solar cells that utilize a firing process to form the electrical connections to a solar cell using a metal containing paste. In one embodiment, the processes described herein are used to form reliable electrical connections to a contact structure formed on a solar cell using an aluminum (Al) paste, which contains aluminum particles disposed therein.

Figure 2A:
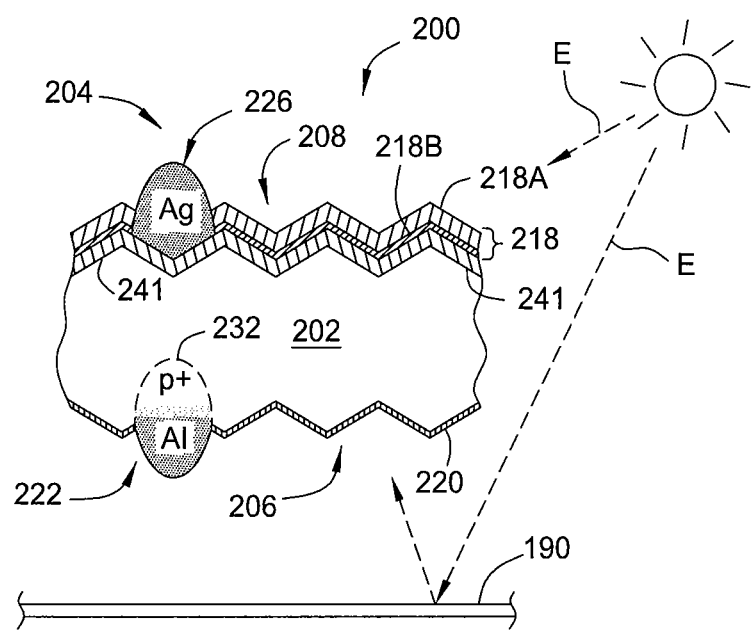
FIG. 2A illustrate a cross-sectional view of a solar cell substrate according to another embodiment of the invention.

FIG. 2A depicts a cross sectional view of a formed bifacial solar cell 200 that may benefit from one or more of the embodiment described herein. The bifacial solar cell 200 is a PERL type bifacial solar cell that is configured to receive electromagnetic energy E from the sun on a front surface 204 and electromagnetic energy E reflected from an external reflector 190 on a rear surface 206 of a solar cell substrate 202. The bifacial solar cell 200 may include a passivation layer 218 formed over an emitter region 241 formed on the front surface 204 and a passivation layer 220 formed on the back surface 206 of the substrate 202, according to one embodiment of the invention. In one example, the passivation layer 218 includes a multilayer stack of dielectric films 218A, 218B that are used to form an ARC layer and passivate the front surface 204 of the solar cell substrate 202. A bifacial solar cell 200 may be fabricated on a crystalline silicon type solar cell substrate 202 that has a textured front surface, such as surface 204 shown in FIG. 2A. While FIG. 2A also illustrates a bifacial solar cell 200 that also has a rear surface 206 that is textured, this configuration is not intended to be limiting to the scope of the invention described herein. In one example, the n-type emitter region 241 includes an $n^+$ doped region that is formed in a p-type doped solar cell substrate 202, or alternately a $p^+$ doped region that is formed in an n-type doped solar cell substrate 202. In some configurations, a "reverse"-type solar cell may be used that includes a substrate 202 that has an n-type doped solar cell substrate, an emitter region 241 that includes an $n^+$ doped region, and p-type regions that are formed by the diffusion of a p-type material found in the rear contact structure 222 (e.g., aluminum paste material that is used to form the rear surface contact region 232) into the substrate. The bifacial solar cell 200 also includes a front contact structure 226 and a back contact structure 222 that have a desired cross-sectional area to carry a desired amount of the generated current when the formed solar cell is exposed to the electromagnetic energy E. The front contact structure 226 and a back contact structure 222 are formed in a desired pattern to assure that a large portion of the electromagnetic energy E is received by the exposed regions (e.g., regions not covered by the front contact structure 226 and the back contact structure 222) of the front surface 204 and rear surface 206 of the substrate 202 in the bifacial solar cell 200. In one example, the front contact structure 226 and back contact structure 222 may comprise one or more conducting materials, such as copper (Cu), silver (Ag), gold (Au), tin (Sn), cobalt (Co), rhenium (Rh), nickel (Ni), zinc (Zn), lead (Pb), palladium (Pd), molybdenum (Mo), and aluminum (Al) or other metals.

FIG. 2B is an isometric view of the front surface 204 of the substrate 202 that has the front contact structure 226 formed thereon. The front contact structure 226 may include busbars 226A and fingers 226B that are sized to efficiently transfer the generated current received at the front surface 204 of the solar cell 200, and minimally block the electromagnetic energy received at the front surface 204 of the solar cell substrate 202. In one example, the front contact structure 226 includes a silver containing material that is formed from a metallic paste that contains silver (Ag) particles. In one example, the front contact structure 226 covers less than about 10% of the front surface 204. In another example, the exposed surface area of the front surface 204 remaining after depositing the front contact structure 226 is between about 98% and about 94%.

FIG. 2C is an isometric view of the rear surface 206 of the substrate 202 that has the rear contact structure 222 formed thereon. The rear contact structure 222 may include busbars 222A (Y-direction) and fingers 222B (X-direction), that are sized to effectively transfer the generated current received at the rear surface 206 of the solar cell 200, and minimally block the reflected electromagnetic energy received at the rear surface 206 of the solar cell substrate 202. In one example, the rear contact structure 222 covers less than about 30% of the rear surface 206. In another example, the exposed surface area of the rear surface 206 remaining after depositing the rear contact structure 222 is between about 90% and about 70% of the rear surface 206. In one configuration, the rear contract structure 222 is formed in a similar geometric pattern on the rear surface 206 as the front contact structure 226 is formed on the front surface 204, but contains between about 50% and about 200% more volume of material to account for difference in the way the materials in each contact structure sinter during the co-firing process and differences in their electrical conductivity. In one example, the front contact structure 226 comprises silver (Ag) and a back contact structure 222 comprises aluminum (Al). In one configuration, wherein the geometric pattern of the deposited material in the front contact structure 226 is the same as the geometric pattern of the deposited material in the rear contact structure 222.

Figure 2D:
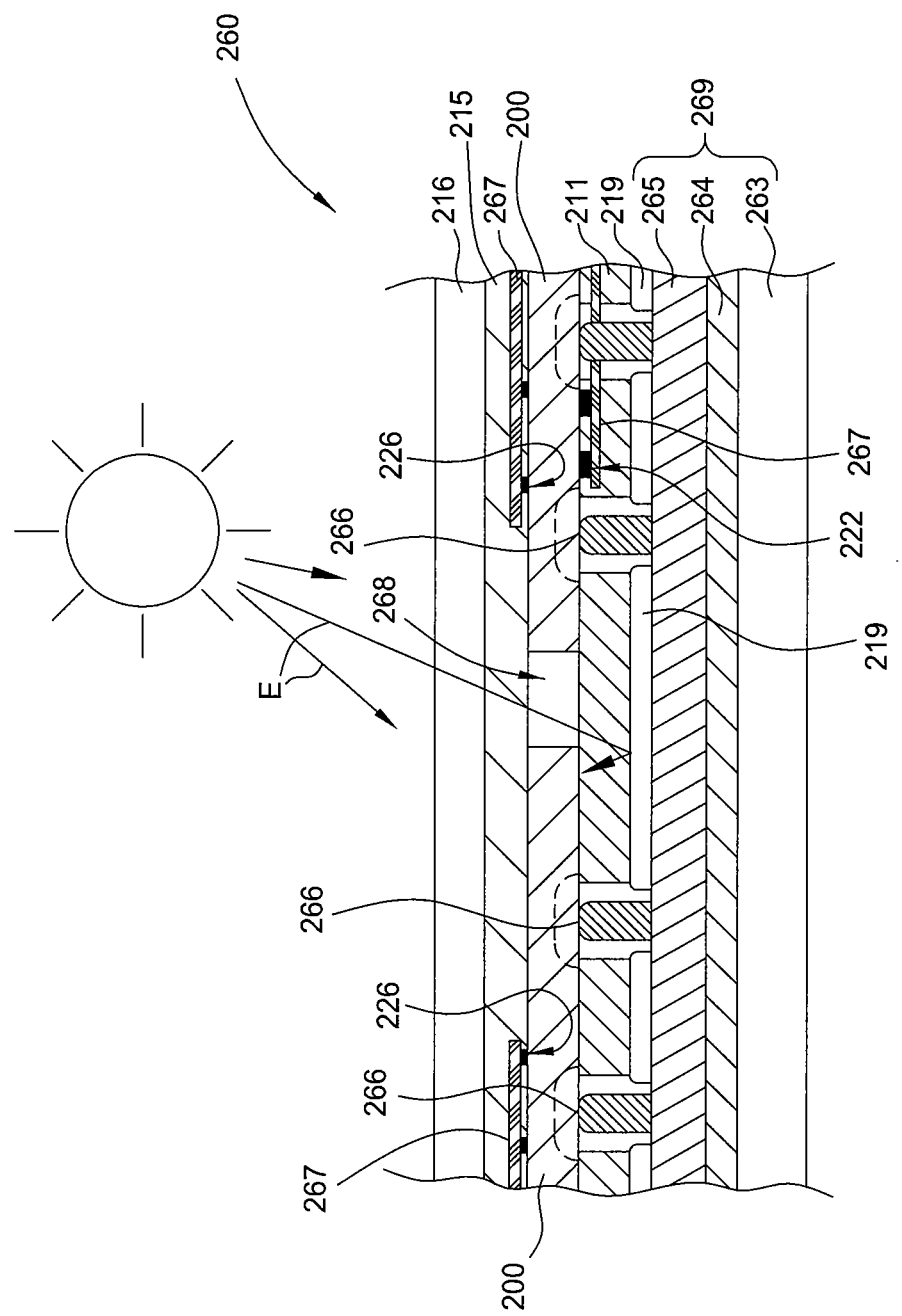
FIG. 2D is a schematic cross-sectional view that illustrates a solar cell module according to one embodiment of the invention.

FIG. 2D illustrates a side cross-sectional view of a formed photovoltaic module 260 that may include one or more embodiments of the invention described herein. In one configuration, as illustrated in FIG. 2D, the photovoltaic module 260 includes a backsheet assembly 269, a reflective layer 219, a module encapsulant material 211 (e.g., EVA), a conductive interconnect material 267, a plurality of solar cells 200, a front encapsulant layer 215 and a glass substrate 216. In one configuration, the backsheet assembly 269 comprises a backsheet 263 (e.g., polyethylene terephthalate (PET) sheet, polyvinyl fluoride (PVDF) sheet), an adhesive layer 264 (e.g., epoxy), a conductive element 265 (e.g., copper foil, aluminum foil) and a plurality of spacer regions 266 (e.g., space the solar cells from the back sheet 269) formed on the conductive element 265. The conductive element 265, as illustrated in FIG. 2D, may comprise one or more conductive sections (e.g., three of the four sections) that are coupled or bonded to the backsheet 263 and are used to interconnect the back contact structures 222 of adjacent solar cells 200. The conductive interconnect material 267 may be a conductive interconnecting material (e.g., stringing material) that is used to interconnect the front contact structures 226 and rear contact structures 222 of each of the solar cells 200 together in a desired electrical configuration. The configuration of the photovoltaic module 260 discussed herein is provided as an example of a device that may benefit from one or more of the embodiments disclosed herein and is not intended to be limiting as to the scope of the invention(s) described herein, since the orientation, position and number of components disposed between the glass substrate 216 and the backsheet 263 can be adjusted without deviating from the basic scope of the invention disclosed herein. The solar cells 200 disposed in the photovoltaic module 260 may comprise many different types of solar cells, but may advantageously include a bifacial solar cell similar to the type shown in FIG. 2A.

In one embodiment, as illustrated in FIG. 2D the solar cells 200 may be arranged so that electromagnetic energy E passes through a gap 268 formed between the substrates 200 and is reflected from a reflective layer 219 formed in the solar cell module 260, so that it can be received on a rear surface 206 of the solar cells 200. In one example, the reflective layer 219 may comprise an air or gas filled gap, a dielectric or plastic film mirror, a dielectric or plastic light scattering element, a ceramic, dielectric, a Fresnel lens or reflector element, or an element of various material coated with a highly reflective metallic thin film such as Al, Ag, Ni, or Au. In one example, the reflective layer 219 is photonic conversion layer that is used to absorb the electromagnetic energy E and then fluorescence at a wavelength that is better absorbed by the active region of the solar cell. In another example, the reflective layer 219 may comprise a plastic "light pipe" capable of increasing the rear side illuminated area by transmitting light laterally through the module to open, nonmetallized areas of the cell. In another embodiment, the reflective layer 219 is a specular or diffuse reflector that is able to reflect or re-direct the received electromagnetic energy E back to the back surface of the solar cell 200.

Figure 3:
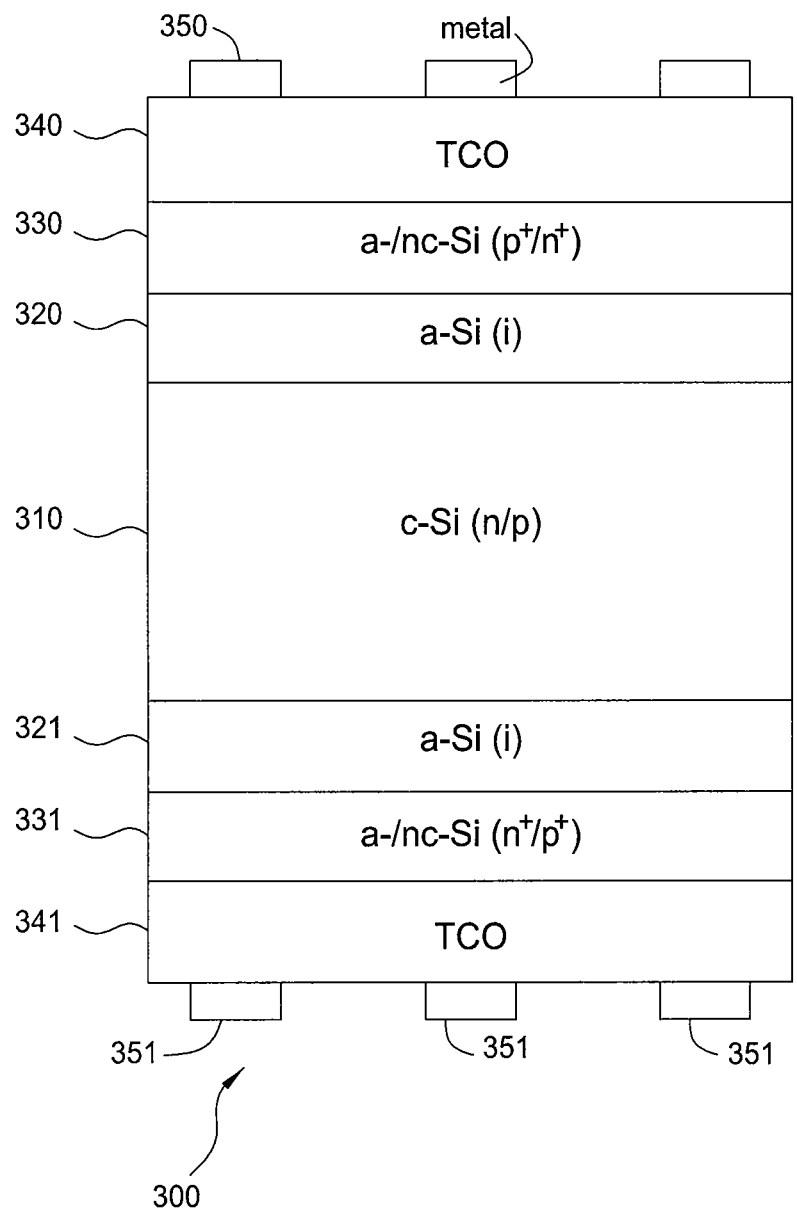
FIG. 3 is a schematic cross-sectional view of a heterojunction (HJ) solar cell according to an embodiment of the invention.

FIG. 3 is a schematic cross-sectional view of a heterojunction (HJ) solar cell 300 that may benefit from one or more of the embodiments described herein. The solar cell 300 comprises an n-type or p-type crystalline silicon (c-Si) layer 310, which may be a silicon wafer sliced from a mono- or polycrystalline silicon ingot and having a thickness of about 20 to 300 μm. A first amorphous silicon (a-Si) layer 320 and a second amorphous silicon layer 321 are disposed on the c-Si layer 310. A first highly-doped p+ or n+ silicon layer 330 may be disposed on the first a-Si layer 320. A second highly-doped n+ or p+ silicon layer 331 may be disposed on the second a-Si layer 321. A first transparent conductive oxide (TCO) layer 340 may be disposed on the first p+/n+ layer 330. A second transparent conductive oxide layer 341 may be disposed on the second n+/p+ layer 330. In embodiments of the invention, the first and second transparent conductive oxide layers 340, 341 comprise one or more large band gap materials, such as indium tin oxide (ITO) or ZnO, which transmit incident radiation to the heterojunction layers disposed below the first and second transparent conductive oxide layers 340, 341. Front contact structure 350 and back contact structure 351 may be disposed on the first and second transparent conductive oxide layers 340, 341. The front contact structure 350 and back contact structure 351 may comprise one or more conducting materials, such as copper (Cu), silver (Ag), gold (Au), tin (Sn), cobalt (Co), rhenium (Rh), nickel (Ni), zinc (Zn), lead (Pb), palladium (Pd), molybdenum (Mo), and aluminum (Al) or other metals. In some configurations, the front contact structure 350 and back contact structure 351 may be discontinuous layers which provide an ohmic contact with the transparent conductive oxide layers 340, 341, while still allowing incident radiation to reach the underlying silicon layers of the heterojunction solar cell 300.

Figure 4:
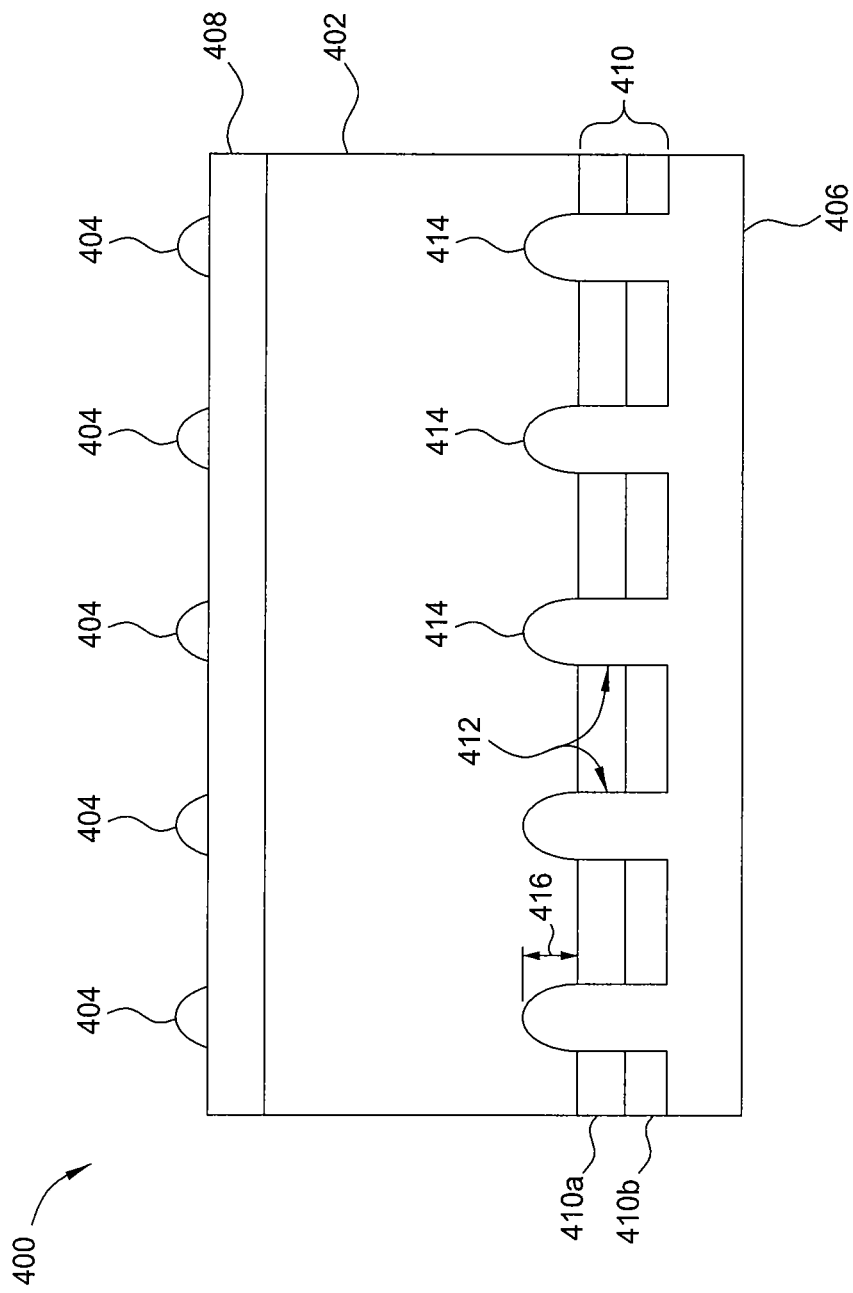
FIG. 4 illustrate a cross-sectional view of a solar cell substrate according to another embodiment of the invention.

FIG. 4 depicts an alternate solar cell configuration that may benefit from one or more of the embodiments described herein. FIG. 4 is a schematic sectional view of a solar cell 400 according to one embodiment of the invention. The solar cell 400 includes a semiconductor substrate 402, such as a silicon substrate, such as a p-type crystalline silicon substrate. The solar cell 400 includes a front surface contact structure 404 disposed on a light-receiving surface of the solar cell 400 and a back surface contact structure 406 disposed on the non-light-receiving surface of the solar cell 400. The front contact structure 404 is arranged in grid-like patterns including one or more busbars and a plurality of fingers coupled therewith and arranged perpendicularly thereto (e.g., similar to FIG. 2B). The front contact structure 404 includes a metal, such as silver or aluminum, and the back contact structure 406, which is a blanket deposited layer includes a metal, such as aluminum. The solar cell 400 also includes an n-type region 408 adjacent to the front contact structure 404, and a passivation layer 410 between the back contact structure 406 and the substrate 402. The passivation layer 410, in combination with local contacts 414, which are formed from the back contact structure material, facilitates formation of a back surface field (BSF) in a region around the local contacts 414 which repels minority charge carriers. The minority charge carriers are repelled due to the presence of a high concentration of a p-type dopant, such as aluminum, within the formed local contacts 414. The repelling of minority charge carriers reduces carrier recombination near the non-light-receiving surface of the solar cell 400. In one configuration, the passivation layer 410 includes two sub-layers, an aluminum oxide layer 410a and a silicon nitride layer 410b. The aluminum oxide layer 410a passivates the rear surface of the solar cell 400 and facilitates formation of local contacts 414, while the silicon nitride layer 410b serves as a protective coating over the aluminum oxide layer. The silicon nitride layer 410b protects the aluminum oxide layer 410a from materials utilized to form the back contact structure 406 during thermal processing steps (e.g., firing steps).

FIGS. 2-4 provide examples of different types of solar cell devices that may benefit from one or more of the embodiments described herein. It is contemplated that various different types of conductive materials, such as metals may be utilized to form either the front contact structure 226, 350, 404 or the back contact structure 222, 351, 406. In some configurations, the front or back contact structures may include one or more metal elements selected from a group consisting of copper (Cu), silver (Ag), gold (Au), tin (Sn), cobalt (Co), rhenium (Rh), nickel (Ni), zinc (Zn), lead (Pb), palladium (Pd), molybdenum (Mo) and aluminum (Al). The front contact structures and back contact structures may be deposited using a physical vapor deposition (PVD), chemical vapor deposition (CVD), atomic layer deposition (ALD), evaporation, screen printing, or liftoff metallization processes. The front contact structure or back contact structure deposited using a PVD, CVD, ALD, evaporation or other similar process may have thicknesses of about 10 to 5,000 nm. Front contact or back contact structures, which are formed by screen-printing processes may have thicknesses of about 10 to 50 μm. In some configurations, the front contact structure 226, 350, 404 and back contact structure 222, 351, 406 may include discontinuous or patterned layers, which desirably provides an ohmic contact with the underlying substrate while still allowing incident radiation to reach the underlying silicon layers of the formed solar cell.

As noted above, embodiments of the disclosure generally provide a method of forming and/or preparing solar cells so that reliable and robust electrical connections can be made between the solar cell and the interconnecting components within a solar cell module. Embodiments of the invention may also provide a method for forming a solar cell structure that utilizes a reduced amount of a silver paste on a front surface of the solar cell substrate and a patterned aluminum metallization paste on a rear surface of the solar cell substrate to form a rear surface contact structure. The methods described herein can be used to reduce the manufacturing cost and increase the power output from a formed solar cell device and solar cell module containing multiple solar cell devices. The processes described herein can be used to form desirable electrical contacts that have good electrical properties and are chemically, galvanically, and mechanically stable.

To reduce the number of processing steps and complexity of forming a solar cell device it is common during a screen printing type process to deposit a metal paste in a desired pattern on a surface of a substrate and then "fire" the deposited paste at a moderate to high temperature to form the front and rear contact structures. Due to the need for high throughput to achieve the manufacturing cost targets, the firing process is typically performed in an open heated region, which may comprise air, that contains at least trace amounts of contaminants and oxygen. These conventional firing apparatuses and processes thus allow some common defects to form in the formed contact layers. Typical defects found in the contact structures formed on a solar cell include incomplete sintering of the metal particles in the deposited metal paste, oxidation of the surface of the formed metal contact structure due to the environment in which the firing process is performed and contamination incorporation into the contact structure from the binder and other components used to make the metal paste flow and bond to the surface of the solar cell substrate to form a good electrical contact thereto. These types of defects increase the electrical resistance of the formed contact structure and affect their ability to withstand the mechanical stresses induced in the contact structure when it is integrated into the interconnected array of solar cells used to form a solar cell module.

Figure 5E:
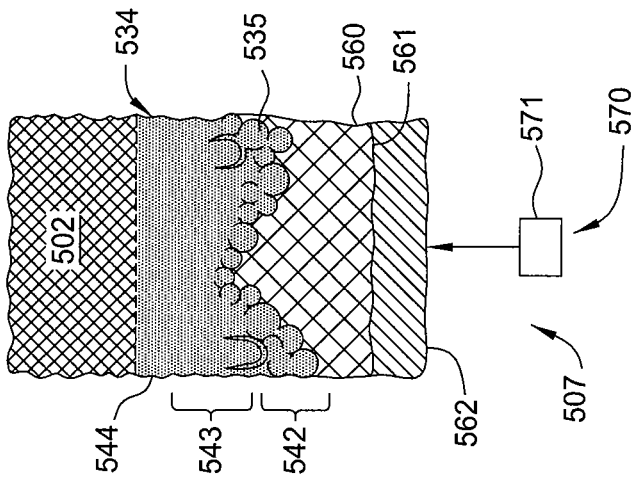

FIG. 5A is a side cross-sectional view of a portion of a solar cell that contains one or more contact structures that are formed using these conventional firing techniques. In this example, the solar cell 500 may include a passivation layer 510 formed over an emitter region 505 formed on the front surface 506 and a passivation layer 511 formed on the back surface 507 of the substrate 502. A solar cell 500 may be fabricated on a crystalline silicon type solar cell substrate 502 that has a textured front surface, such as surface 506, as shown in FIG. 5A. In one example, the substrate 502 includes a p-type base region, an n-type emitter region 505, and a p-n junction region disposed therebetween. In one example, the n-type emitter region 505 includes an n+ doped region that is formed in a p-type doped solar cell substrate, or alternately a p+ doped region that is formed in an n-type doped solar cell substrate 502. The solar cell 500 also includes a front contact structure 521 and a rear contact structure 531 that have a desired cross-sectional area to carry a desired amount of the generated current and are formed in a desired pattern to assure that a large portion of the electromagnetic energy E is received by the exposed regions of the of the substrate 502 in the solar cell 500. While FIG. 5A illustrates a solar cell that has patterned electrical contact structures on the front surface 506 and the back surface 507, this configuration is not intended to be limiting as to the scope of the invention described herein. In one example, the front contact structure 521 includes a silver containing material that is formed from a metallic paste that contains silver (Ag) particles. In one example, the front contact structure 521 covers less than about 10% of the front surface 506, and the rear contact structure 531 that is formed using an aluminum (Al) paste, which contains aluminum particles disposed therein, to form electrical contacts and back-surface-field (BSF) regions on the rear surface of a p-type substrate. In one embodiment, the aluminum paste is selected to facilitate the low temperature dissolution of an aluminum oxide, found in the passivation layer 511, and the formation of aluminum silicon alloys during a metal contact co-firing process.

Figure 5D:
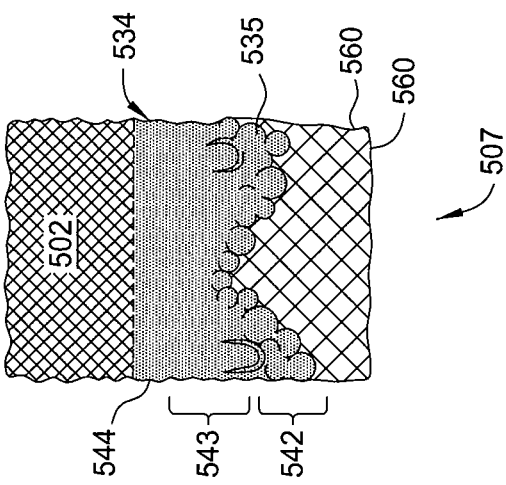
Figure 6:
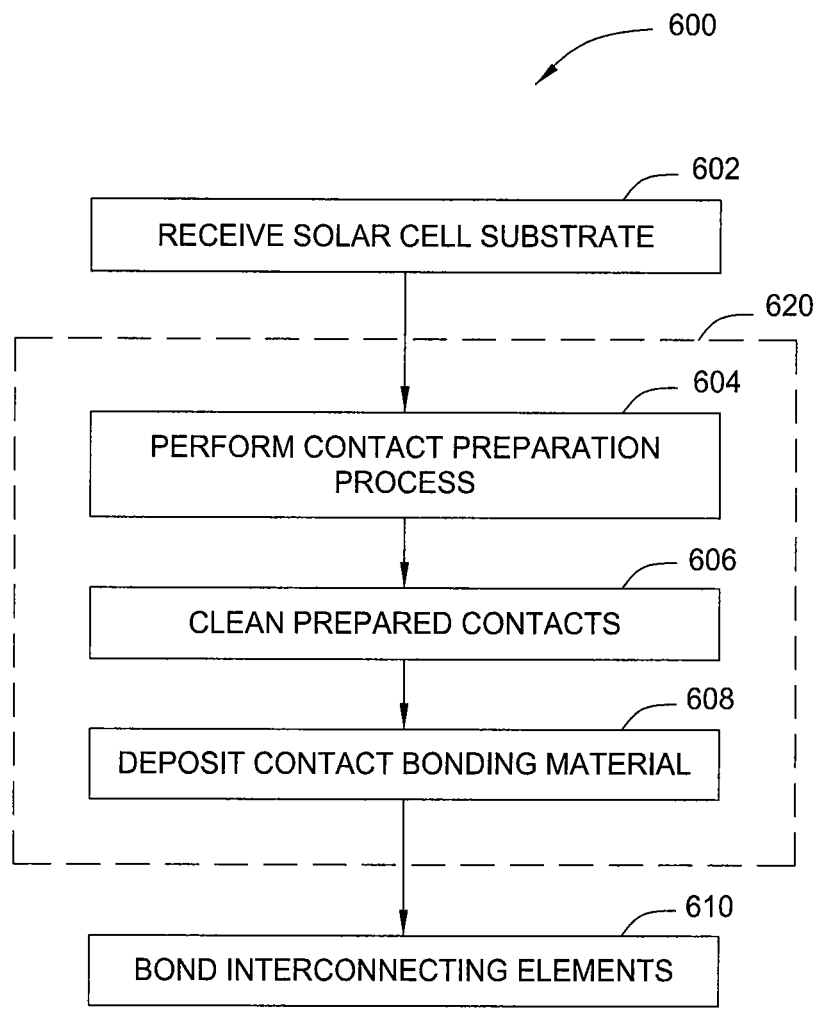
FIG. 6 is a block diagram of a processing sequence used to form solar cell devices in accordance with one embodiment of the present invention.

FIGS. 5B-5E depict cross-sectional views of a portion of a back contact formed in the back contact structure 531 during different stages of a contact enhancement process 620 that is illustrated in FIG. 6 according to one embodiment of the invention. FIG. 6 is a block diagram of a processing sequence 600 used to form a solar cell device in accordance with one embodiment of the present invention. It is noted that the processing sequences depicted in FIGS. 5B-5E and 6 are only used as an example of a process flow that can be used to manufacture a solar cell device. Some of the embodiments of the processing sequence 600, as illustrated in FIG. 6, include a contact preparation process 620 that is used to prepare the rear contact structure and/or the front contact structure of a solar cell for electrical connection to other solar cells in a solar cell module and/or an external load. In one configuration, the prepared rear contact structure 531 and front contact structure 521 enable a good electrical connection to be formed with the connecting elements used in a stringing process, which is used to interconnect multiple solar cells in a solar cell module together. The contact preparation process may include a contact enhancement process 604, an optional cleaning process 606 and a bonding material deposition process 608. Additional steps may be added in between the steps depicted in FIG. 6 as needed to form a desirable solar cell device. Similarly, some steps depicted herein may also be eliminated as needed.

FIG. 5B is a close-up side cross-sectional view of a portion of an electrical contact 533 formed in the back contact structure 531. In this example, the electrical contact 533 includes a sintered metal paste structure that has been formed using a conventional firing process and has not been further processed using the contact enhancement process 620, which is discussed below. In one example, the electrical contact 533 is a portion of a busbar formed on a surface of the solar cell (e.g., busbar 222A in FIG. 2C).

In an alternate example, the electrical contact 533 includes a patterned layer of conductive material that is deposited by a physical vapor deposition (PVD) process. In this case, the patterned PVD layer may also benefit from one or more of the steps found in the contact enhancement process 620, which is discussed below.

The formed electrical contact 533 may include an unwanted oxidation 536 that is formed on a surface of the formed metallic layer due to ambient exposure or due to oxidizing components found in the processing environment during the firing process performed in a firing process chamber. The degree of oxidation will depend on the type of material used to form the electrical contact and will generally prevent a good ohmic contact from being subsequently formed to the metal material in the electrical contact 533. Due to aluminum's high affinity for oxygen, contacts that are formed from an aluminum containing metal paste typically have a large amount of oxidation that will typically affect its ability to form a good electrical contact to the conductive stringing elements in a solar cell module. Stringing elements, which typically include a metal ribbon, a metal rod or formed metal sheet, are typically used to interconnect solar cells within a solar cell module.

The electrical contact 533 comprises a plurality of metal particles 535 that are fused together during a sintering process to form a densified metallic structure. As is typical in these types of electrical contacts, which are formed by use of a firing process, the metal structure includes a metallic layer that has a gradient in density that typically varies in a direction normal to the surface of the substrate (Z-direction). In one example, the electrical contact 533 includes a density gradient that can be characterized as having three zones 541-543. The first zone 541 typically includes a region of the electrical contact that has a relatively porous structure and a significant amount of oxidation. The second zone 542 typically includes a region of the electrical contact that has an increased density and higher degree of bonding (or sintering) created between the metal particles 535. The third zone 543 typically includes a region of the electrical contact that is very dense and is well adhered to the solar cell substrate 502. The third zone will also typically contain a significant amount of diffusion of the metal particle material into the substrate's surface. In one example, the substrate 502 includes BSF region 534 that includes a region of the substrate (e.g., silicon substrate) that has a significant amount of one or more metal elements found in the metal particles 535 (e.g., aluminum) diffused therein.

Process Sequence Examples

In the embodiment, as depicted in FIGS. 5A and 6, the process sequence 600 starts at step 602 by providing a solar cell that has a contact structure formed on a surface of a solar cell substrate. In general, the solar cell can be any type of solar cell that has a contact structure formed on one or more of its surfaces, and can include a CRAFT, nCRAFT, pCRAFT, PERC, PERL, PERT, "iPERC", EWT, MINT, IBC or other types of solar cells In one example, the received solar cell includes a solar cell similar to the solar cell 500 discussed above. As noted above, the solar cell 500 also includes a front contact structure 521 and a rear contact structure 531 formed on the front and back surfaces of the substrate, respectively.

Next at step 604, a contact preparation process is performed on at least one of the contact structures formed on the solar cell 500. In one embodiment, the contact preparation process 604 includes a process of etching, abrading, laser ablation and/or performing some mechanical or chemical preparation process that is able to remove any exposed oxides or other contaminants found on a surface 522 or 532 (FIG. 5A) of the front contact structure 521 and/or the back contact structure 531. Step 604 can also be used to remove any partially sintered metallic material found in the back contact structure 531 or front contact structure 521, so that a good ohmic contact can be made to the substrate 502 and to portions of the rear contact or front contact structures during the subsequent module fabrication process(es). In one example, as shown in FIG. 5C, the contact preparation process 604 includes the removal of the first zone 541 of the electrical contact 533 to expose the underlying metal particles 535 that have very little oxidation and have a relatively strong intermetallic bond, so that the subsequently bonded stringing material will form a good electrical contact and mechanical bond with the substrate 502. In another example, the contact preparation process 604 includes the removal of the first zone 541 and/or second zone 542 of the electrical contact 533 to expose the substrate 502 and inter-diffused region 538 found in the third zone 543 to assure that a good electrical contact can be formed to the substrate.

In one embodiment, the contact enhancement process 620 includes abrading the material used to form the back contact structure 531 (e.g., sintered aluminum paste) and/or the front contact structure 521 (e.g., sintered silver paste) with an abrading material. In one example, the contact preparation process 604 includes directing a flow of the abrading material to the used to the rear contact structure 531 and/or the front contact structure 521. In this case, the process may include removing material from the formed rear contact structure 531 and/or the front contact structure 521 using a grit blasting process that is only applied to desired regions, or surfaces 522 and 532, of the formed interconnect structures by use of masking components. In some embodiments, grit blasting includes the steps of directing a flow of a fluid (e.g., clean dry air (CDA), nitrogen gas) that contains the abrading material to a desired region on the surface of the substrate. The masking material (not shown) may include a rigid material that has openings sized to expose the surface 522 or 522 of the contact structure while not allow appreciable exposure to the other regions of the solar cell that are adjacent to the formed contact structures. The masking material may also comprise tape or other conventional grit blasting masking materials. In one example, the abrading material may include glass beads, garnet or aluminum oxide particles.

The contact preparation process 604 may include the use of an abrading material that has a Mohs hardness (traditional Mohs scale from 1 to 10, with 10 being diamond hardness on this scale) greater than the material used to form the front contact structure 521 and the rear contact structure 531. In one example, the material in the contact structure 521 or 531 comprises a material that has a Mohs hardness that is less than about 4, such as sintered aluminum or other similar material that has a Mohs hardness less than about 2.5, or even less than about 1.5. In some embodiments of step 604, it is desirable to select an abrading material, such as a grit blasting material, that has a hardness that is greater than the material that is used to form the front contact structure 521 and the rear contact structure 531 to improve the removal efficiency of any lightly adhered material. Also, in some cases, it is desirable to select an abrading material that has a hardness that is greater than the material that is used to form the front contact structure 521 and the rear contact structure 531, and also has a hardness less than the material used to form the substrate 502 (e.g., crystalline silicon (Mohs hardness of about 7-7.3)) and/or the material used to form the inter-diffused region 538 (e.g., silicon-aluminum alloy ($Si_xAl_y$)). In one example, the abrading material has a Mohs hardness between about 1.5 and about 7.0, such as a between 5.0 and 5.5. Therefore, during the performance of step 604, the softer material, which is used to form the front contact structure 521 and the rear contact structure 531, can be easily removed and the harder material that forms the substrate 502 and inter-diffused region 538 will tend to have minimal erosion, crack formation or other similar damage created by the use of the abrading material during the contact preparation process. In this case, the harder substrate and/or material used to form the inter-diffused region 538 act as an etch-stop, and thus will not be significantly damaged if an extended exposure to the abrading material accidentally occurs.

In an alternate embodiment, the contact enhancement process 620 includes delivering a laser ablation pulse to the back contact structure 531 and/or the front contact structure 521 by delivering an amount of electromagnetic energy to the surfaces 522 and/or 532 of the interconnect structures. In one embodiment, the electromagnetic energy is provided by a laser source that is configured to produce a pulse at a pulse width of about 1 femtoseconds (fs) to about 1.5 microseconds (µs) and a total energy of from about 10 µJ/pulse to about 6 mJ/pulse. The repetition rate of the laser pulse may be between about 15 kHz and about 2 MHz. The laser type of electromagnetic radiation source may be a Nd:YAG, Nd:YVO$_4$, crystalline disk, fiber-diode and other similar radiation emitting source that can provide and emit a continuous wave or pulsed type of radiation at a wavelength between about 255 nm and about 1064 nm. The power of the laser diodes may be in the range of about 5 W to about 15 W.

At step 606, one or more portions of the rear contact structure 531 and/or the front contact structure 521 are optionally cleaned to remove any undesirable materials left thereon after performing step 604. The one or more portions of the back contact structure 531 and/or the front contact structure 521 may be cleaned using a wet cleaning process, a blow drying process, super critical $CO_2$ cleaning process, wiping the surface with a cloth or other useful cleaning process.

At step 608, a conductive material 560 (FIG. 5D) may be formed over the regions on which the processes performed in step 604 were applied, to form a desirable region that can be easily electrically connected to in a subsequent processing step. In one embodiment, the processes at step 608 include depositing a conductive material 560, or also referred to herein as a bonding material, on the regions on which the processes performed in step 604 were applied. The bonding material is chosen, such that it can make a conductive and chemically, galvanically, and mechanically stable contact to one or more of the layers in contact region of the solar cell (e.g., $AlO_x$, Al, AlSi, Si). Examples of bonding materials are alloys containing one or more of the following elements Pb, Sn, Ag, Bi, In, Sb, Ti, Mg, Ga, Ce or other metals. The metals are chosen to balance the chemical oxidation resistance of the contact structure material (e.g., aluminum), ductility and brittleness of the soldered contact, stress of the soldered contact, conductivity of the contact, and cost of the solder. The method of depositing and activating the solder can be inductive (thermal), ultrasonic, laser, microwave, plasma, or any combination of these techniques. In one embodiment, the bonding material is connected to an external contact structures using a soldering material that may contain a solder material (e.g., Sn/Pb, Sn/Ag). In one embodiment, the busbar or busbar is coated with a solder material, such as a Sn/Pb or other useful solder material.

In one embodiment, step 608 is formed by providing an amount of the conductive material 560 to the regions of the contact structure processed during step 604 and delivering an amount of energy to cause the amount of the conductive material to form a good electrical and mechanical bond to the remaining portion of the electrical contact 533 and/or substrate 502 (FIG. 5D). In one embodiment, this process is performed by use of an ultrasonically driven applicator, thermal soldering tip, laser or other means of delivering energy to a desired region of the electrical contact 533 within the contact structure.

The conductive material 560 may or may not have the ability to bond to the contact site without activation. By activating the conductive material 560, the material forms strong chemical bonds to the contacting site, causing bonding strength to increase (e.g., >100%). In one application, the conductive material 560 is activated by means of ultrasonic energy delivered by a sonotrode or ultrasonically and thermally active soldering tip. In one application, the ultrasonic power delivered by the sonic tip, or sonotrode, is at least 1.5 W per mm$^2$, or 4 W per mm$^2$. In one example, the conductive material 560 is activated by other means heating the material to a temperature of at least 200 degrees Celsius by delivering an energy of at least 1.5 W per mm$^2$ at the contacting site. In one application, the activated conductive material 560 has an average peel strength in excess of 6 N per mm of peel.

In one example, the conductive material 560 is applied to the region of the electrical contact by use of a roller or wheel transfer process. In another example, the conductive material 560 is applied to the region of the electrical contact 533 by use of a solder jet process that directs and delivers a metered amount of material thereon. In some cases, the conductive material 560 is delivered to the electrical contact 533 by use of an ink jet printing, ultrasonic jetting, piezoelectric jetting, pneumatic jetting, or other similar jetting process that is able to direct and deliver a metered amount of material from a reservoir to the electrical contact 533. The jetting processes may or may not need to be subsequently activated (e.g., ultrasonically activated) to form a desirable contact. In another example, the conductive material 560 is applied to the region of the electrical contact 533 by use of a soft transfer process that uses a stamp to deliver a desired amount of material thereon. In another example, the conductive material 560 is formed into spherical or foil-like segments or particles that are transferred to the primed contact. In another example, conductive material 560 is formed into spherical particles and delivered to the contact by mechanical positioning, a compressed air jet, piezoelectric induction, laser reflowing, laser tweezers, electrostatic positioning, or by the use of gravity.

In an alternate embodiment of step 608, the conductive material 560 deposited directly on a transparent conductive oxide (TCO) layer that is formed on either the front or back surface of the solar cell. The processes performed at step 608 include depositing a conductive material 560 on the regions of the TCO layer that did not receive the contact preparation process performed in step 604. Alternately, the processes performed at step 608 include depositing a conductive material 560 on the regions of the TCO on which the processes performed in step 604 were applied. The bonding material is chosen, such that it can make a conductive and chemically, galvanically, and mechanically stable contact to the TCO layers formed on the solar cell. Typical TCO layers may include indium tin oxide (ITO), tin oxide (SnO$_x$), zinc oxide (ZnO$_x$) and aluminum-doped zinc-oxide (AZO). The methods of depositing and activating the solder can be inductive (thermal), ultrasonic, laser, microwave, plasma, or any combination of these techniques.

At step 610, an interconnecting element, such as a stringing element or conductive wire 562, is bonded to the conductive material 560 to form a desirable electrical connecting element that can be used to electrically connect the solar cell to other solar cells in a solar cell module in a subsequent processing step. In one embodiment, the processes at step 610 include bonding a conductive wire 562 to the conductive material 560 by delivering energy from an energy source 570 to a desired region of the electrical contact 533 and the conductive wire 562 to cause a bond to form at a junction between the conductive wire 562 and conductive material 560. In one example, the energy is applied to the junction by use of a source 571, which may include an ultrasonically driven applicator, thermal soldering tip, laser or other means of delivering energy to the junction. In one example, the conductive wire 562 is an uncoated aluminum wire that is able to form a good contact to the conductive material 560 due to its chemical and mechanical properties. In some configurations, the conductive wire 562 includes a wire, rod, ribbon or tape material that has a pre-patterned layer of solder material disposed thereon to minimize the cost of forming a completely coated piece, while still enhancing the ability to connect the conductive wire 562 with the conductive material 560.

In one embodiment, steps 608 and 610 are combined into a single step that allows the conductive wire 562 to be bonded to the conductive material 560 and back contact structure 531 at one time to form a desirable electrical connecting element that can be used to electrically connect the solar cell to other solar cells in a solar cell module in a subsequent processing step.

In one alternate embodiment of process sequence 600, process steps 604 and/or 606 are not performed, since the back contact structure 531 and/or front contact structure 521 will not benefit from their completion. Therefore, in this case the process sequence 600 generally includes step 602, 608 and 610. This configuration may be useful in cases where the back contact structure 531 and front contact structure 521 comprise a layer that has been deposited by a PVD or CVD process. In one example, the PVD or CVD deposited layers of material are used to form the back contact structure and front contact structure that are part of a heterojunction solar cell device (e.g., FIG. 3).

While the foregoing is directed to embodiments of the present invention, other and further embodiments of the invention may be devised without departing from the basic scope thereof, and the scope thereof is determined by the claims that follow.

What is claimed is:

1. A method of manufacturing a solar cell device, comprising:
   removing an amount of a first conductive material from a region of a formed electrical contact structure formed on a surface of a substrate to expose at least a portion of an inter-diffused region formed in the surface of the substrate;
   depositing a second conductive material on the region of the formed electrical contact structure; and
   bonding a first conductive element to the second conductive material by delivering an amount of energy to the region and the second conductive material.

2. The method of claim 1, wherein the first conductive material comprises a conductive layer formed from a metal paste that was heated to form at least a portion of the electrical contact structure, wherein the conductive layer was formed prior to removing the amount of the first conductive material.

3. The method of claim 2, wherein the first conductive material comprises aluminum.

4. The method of claim 2, wherein the metal paste comprises metal particles.

5. The method of claim 4, wherein the metal particles comprise a material selected from the group consisting of aluminum or silver.

6. The method of claim 1, wherein removing the amount of the first conductive material comprises delivering a flow of an abrading material to the region of the electrical contact structure.

7. The method of claim 6, wherein the abrading material has a hardness that is greater than the first conductive material.

8. The method of claim 7, wherein the substrate comprises a second material, and the hardness of the abrading material is less than the hardness of the second material.

9. The method of claim 8, wherein the second material comprises silicon or a silicon-aluminum alloy.

10. The method of claim 1, wherein the depositing a second conductive material comprises:
   delivering an amount of the second conductive material to the region; and
   delivering energy to the second conductive material using ultrasonic energy, thermal energy or electromagnetic radiation from a laser.

11. The method of claim 1, wherein the second conductive material comprises an element selected from a group consisting of Pb, Sn, Ag, Bi, In, Sb, Ti, Mg, Ga, or Ce.

12. The method of claim 1, further comprising:
   depositing a metal paste on the surface of the substrate; and
   heating the metal paste in a processing environment to form the electrical contact structure, wherein the metal paste comprises metal particles that comprise aluminum.

13. The method of claim 12, wherein processing environment comprises heating the metal paste in air to cause the metal particles to densify.

14. The method of claim 1, further comprising:
   depositing a metal paste on the surface of the substrate;
   heating the metal paste in a processing environment to form the electrical contact structure, wherein the metal paste comprises metal particles.

15. The method of claim 14, wherein the metal particles comprise a metal selected from the group of copper (Cu), silver (Ag), gold (Au), tin (Sn), cobalt (Co), rhenium (Rh), nickel (Ni), zinc (Zn), lead (Pb), palladium (Pd), molybdenum (Mo) and aluminum (Al).

16. The method of claim 14, wherein the metal particles comprise silver.

17. A method of manufacturing a solar cell device, comprising:
   forming an electrical contact structure on a surface of a solar cell substrate by heating a metal paste that is disposed on a surface of a solar cell substrate, wherein the metal paste comprises aluminum;
   removing a portion of the electrical contact structure to expose at least a portion of an inter-diffused region formed in the surface of the solar cell substrate when forming the electrical contact structure, wherein removing the portion of the electrical contact structure comprises delivering a flow of an abrading material to the portion of the electrical contact structure; and
   depositing a conductive material on the exposed inter-diffused region.

18. The method of claim 17, further comprising:
   bonding a first conductive element to the conductive material by delivering an amount of energy to the deposited conductive material,
   wherein the conductive material comprises an element selected from a group consisting of Pb, Sn, Ag, Bi, In, Sb, Ti, Mg, Ga, or Ce.

19. The method of claim 17, wherein the abrading material has a hardness that is greater than the material in the electrical contact structure.

20. The method of claim 19, wherein the substrate comprises a second material, and the hardness of the abrading material is less than the hardness of the second material.

* * * * *

UNITED STATES PATENT AND TRADEMARK OFFICE
CERTIFICATE OF CORRECTION

| | | |
|---|---|---|
| PATENT NO. | : 9,040,409 B2 | |
| APPLICATION NO. | : 14/213316 | |
| DATED | : May 26, 2015 | |
| INVENTOR(S) | : Kumar et al. | |

It is certified that error appears in the above-identified patent and that said Letters Patent is hereby corrected as shown below:

In the specification,

Column 10, Line 49, delete "MINT" and insert --MWT-- therefor.

Signed and Sealed this
Third Day of November, 2015

Michelle K. Lee
*Director of the United States Patent and Trademark Office*